(12) United States Patent
Hitora et al.

(10) Patent No.: US 11,038,026 B2
(45) Date of Patent: *Jun. 15, 2021

(54) CRYSTALLINE MULTILAYER STRUCTURE AND SEMICONDUCTOR DEVICE

(71) Applicant: FLOSFIA INC., Kyoto (JP)

(72) Inventors: Toshimi Hitora, Kyoto (JP); Masaya Oda, Kyoto (JP)

(73) Assignee: FLOSFIA INC., Kyoto (JP)

( * ) Notice: Subject to any disclaimer, the term of this patent is extended or adjusted under 35 U.S.C. 154(b) by 357 days.

This patent is subject to a terminal disclaimer.

(21) Appl. No.: 16/118,402

(22) Filed: Aug. 30, 2018

(65) Prior Publication Data

US 2019/0013384 A1   Jan. 10, 2019

Related U.S. Application Data

(63) Continuation of application No. 14/578,017, filed on Dec. 19, 2014, now Pat. No. 10,090,388.

(30) Foreign Application Priority Data

Mar. 31, 2014   (JP) ................................. 2014-072780

(51) Int. Cl.
*H01L 29/24*   (2006.01)
*H01L 21/02*   (2006.01)
(Continued)

(52) U.S. Cl.
CPC .......... *H01L 29/24* (2013.01); *H01L 21/0242* (2013.01); *H01L 21/0243* (2013.01);
(Continued)

(58) Field of Classification Search
None
See application file for complete search history.

(56) References Cited

U.S. PATENT DOCUMENTS

2007/0287221 A1   12/2007   Ong et al.
2008/0102632 A1   5/2008   Han
(Continued)

FOREIGN PATENT DOCUMENTS

CN   103325817 A   9/2013
EP   2 865 789 A1   4/2015
(Continued)

OTHER PUBLICATIONS

Akaiwa, K., and S. Fujita, "Electrical Conductive Corundum-Structured α-$Ga_2O_3$ Thin Films on Sapphire With Tin-Doping Grown by Spray-Assisted Mist Chemical Vapor Deposition," Japanese Journal of Applied Physics 51(7R):070203-1-070203-3, Jul. 2012.

(Continued)

*Primary Examiner* — Bo B Jang
(74) *Attorney, Agent, or Firm* — Christensen O'Connor Johnson Kindness PLLC

(57) ABSTRACT

Provided is a crystalline multilayer structure having good semiconductor properties. The crystalline multilayer structure includes a base substrate and a corundum-structured crystalline oxide semiconductor thin film disposed directly on the base substrate or with another layer therebetween. The crystalline oxide semiconductor thin film is 0.1 μm or less in a surface roughness (Ra).

20 Claims, 1 Drawing Sheet

(51) Int. Cl.
*H01L 29/66* (2006.01)
*H01L 29/786* (2006.01)

(52) U.S. Cl.
CPC .... *H01L 21/0262* (2013.01); *H01L 21/02488* (2013.01); *H01L 21/02565* (2013.01); *H01L 21/02576* (2013.01); *H01L 21/02581* (2013.01); *H01L 21/02587* (2013.01); *H01L 21/02628* (2013.01); *H01L 29/66969* (2013.01); *H01L 29/7869* (2013.01); *H01L 29/78696* (2013.01); *H01L 21/02631* (2013.01)

(56) References Cited

U.S. PATENT DOCUMENTS

| | | |
|---|---|---|
| 2011/0156022 A1 | 6/2011 | Yamazaki et al. |
| 2013/0248852 A1 | 9/2013 | Yokozeki |
| 2014/0217470 A1 | 8/2014 | Sasaki et al. |
| 2014/0217471 A1 | 8/2014 | Sasaki |
| 2015/0225843 A1 | 8/2015 | Oda |

FOREIGN PATENT DOCUMENTS

| | | |
|---|---|---|
| JP | 2013-028480 A | 2/2013 |
| WO | 2013/035843 A1 | 3/2013 |
| WO | 2013/035844 A1 | 3/2013 |

OTHER PUBLICATIONS

Extended European Search Report dated Sep. 21, 2015, issued in corresponding European Application No. 14199093.7, 10 pages.
Chinese First Office Action dated May 31, 2017, issued in corresponding Chinese Application No. 201510145934.9, filed Mar. 30, 2015, 11 pages.
Office Action dated Aug. 8, 2017, issued in corresponding Taiwanese Application No. 105143387, filed Mar. 30, 2015, 7 pages.
Shinohara, Daisuke, et al. "Heteroepitaxy of Corundum-Structured α-Ga2O3 Thin Films on α-Al2O3 Substrates by Ultrasonic Mist Chemical Vapor Deposition," Japanese Journal of Applied Physics, vol. 47, No. 9, 2008, pp. 7311-7313.
Akaiwa, Kazuaki, et al. "Electrical Conductive Corundum-Structured α-Ga2O3 Thin Films on Sapphire with Tin-Doping Grown by Spray-Assisted Mist Chemical Vapor Deposition," Japanese Journal of Applied Physics, vol. 51, 2012, pp. 070203-1-070203-3.
"Notification of Reasons for Refusal", dated Dec. 15, 2017, received Jan. 15, 2018, in related Japanese Patent Application No. 2015-070469, 7 pages. English language translation included.
Machine generated English translation of JP 2013-028480.
Fujita et al., "Heteroepitaxy of Corundum-Structured α-Ga2O3 Thin Films on α-Al2O3 Substrates by Ultrasonic Mist Chemical Vapor Disposition," 2008, Japanese Journal of Applied Physics, 47(9), pp. 7311-7313.

US 11,038,026 B2

CRYSTALLINE MULTILAYER STRUCTURE AND SEMICONDUCTOR DEVICE

TECHNICAL FIELD

The present invention relates to a crystalline multilayer structure and a semiconductor device.

BACKGROUND ART

Known methods for forming a gallium oxide-based thin film having high crystallinity on a sample to be deposited include a film forming method using water fine particles, such as the mist CVD method (Patent Literature 1: Japanese Unexamined Patent Application Publication No. 2013-28480). For example, this method is used as follows: a gallium compound such as gallium acetylacetonate is dissolved in an acid such as hydrochloric acid to form a raw-material solution; the raw-material solution is atomized into raw-material fine particles; the raw-material fine particles are carried by a carrier gas onto the film forming surface of the sample; and the raw-material fine particles being in a mist state is caused to react to form a thin film on the film forming surface. Thus, a gallium oxide-based thin film having high crystallinity is formed on the sample.

To form a semiconductor device using a gallium oxide-based thin film, it is required to control the electrical conductivity of the thin film. Patent Literature 1 and Non-Patent Literature 1 [Electrical Conductive Corundum-Structured α-$Ga_2O_3$ Thin Films on Sapphire with Tin-Doping Grown by Spray-Assisted Mist Chemical Vapor Deposition, *Japanese Journal of Applied Physics*, 51 (2012) 070203] disclose technologies for doping an α-gallium oxide thin film.

SUMMARY OF INVENTION

The methods of Patent Literature 1 and Non-Patent Literature 1 allow for a formation of highly conductive α-gallium oxide thin films; however, they have a problem specific thereto, that is, the surfaces of the formed thin films are not smooth. None of such thin films are satisfactory enough for use in semiconductor devices. While a surface treatment such as etching can be performed to smooth the film surface, the surface treatment causes problems such as a cut-away of the thin film or a degradation of the semiconductor properties.

An object of the present invention is to provide a crystalline multilayer structure having good semiconductor properties.

In order to achieve the above-mentioned objective, the present inventors have made intensive investigation. As the result, the present inventors found that through doping with an abnormal grain inhibitor, it was possible to obtain a crystalline multilayer structure including a crystalline oxide semiconductor thin film having a smooth surface. The present inventors conducted further examination and then finally completed the present invention.

According to the present invention, a crystalline multilayer structure includes a base substrate and a corundum-structured crystalline oxide semiconductor thin film disposed directly on the base substrate or with another layer therebetween. The crystalline oxide semiconductor thin film is 0.1 µm or less in surface roughness (Ra).

The crystalline multilayer structure of the present invention includes a crystalline oxide semiconductor thin film having a smooth surface and has good semiconductor properties.

DESCRIPTION OF EMBODIMENTS

Figure 1:
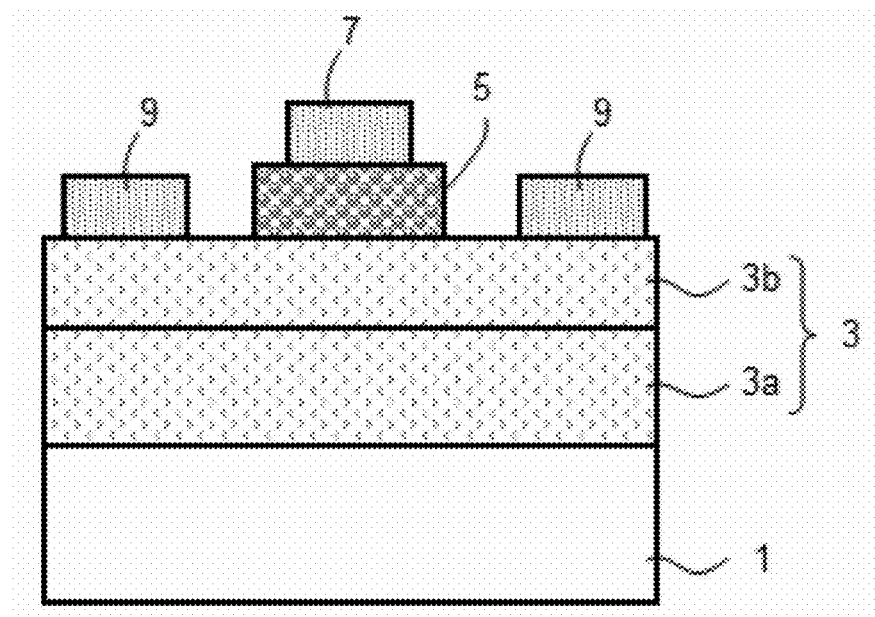
FIG. 1 shows an example configuration of a crystalline multilayer structure of an embodiment of the present invention.

A crystalline multilayer structure of an embodiment of the present invention includes a base substrate and a corundum-structured crystalline oxide semiconductor thin film disposed directly on the base substrate or with another layer therebetween. The surface roughness (Ra) of the crystalline oxide semiconductor thin film is 0.1 µm or less. The surface roughness (Ra) is not particularly limited as long as it is 0.1 µm or less, but is preferably 30 nm or less, more preferably 10 nm or less. As used herein, the surface roughness (Ra) refers to an arithmetic average roughness value obtained by making a measurement according to JIS B0601.

The "crystalline multilayer structure" refers to a structure including one or more crystal layers and may include layers other than the crystal layers (e.g., amorphous layers). Each crystal layer is preferably a monocrystalline layer, but may be a polycrystalline layer. The crystalline oxide semiconductor thin film may be one which has been annealed after being formed. Further, due to the oxidation of an ohmic electrode by annealing, a metal oxide film may be formed between the crystalline thin film and the ohmic electrode. Examples of the ohmic electrode include indium and titanium.

Base Substrate

The base substrate is not particularly limited as long as it serves as a base for the crystalline oxide semiconductor thin film. It is typically an insulator substrate and preferably has a corundum structure. Examples of a corundum-structured substrate include sapphire substrates (e.g., c-plane sapphire substrates) and α-phase gallium oxide substrates. The base substrate needs not necessarily have a corundum structure.

Examples of the base substrate not having a corundum structure include substrates having a hexagonal structure (e.g., 6H-SiC substrates, ZnO substrates, GaN substrates). For a substrate having a hexagonal structure, it is preferred to form a crystalline oxide semiconductor thin film directly on the base substrate or with another layer (e.g., buffer layer) therebetween. The thickness of the base substrate is not particularly limited, but is preferably 50 to 2000 µm, more preferably 200 to 800 µm.

Crystalline Oxide Semiconductor Thin Film

The crystalline oxide semiconductor thin film is not particularly limited as long as it includes a corundum-structured oxide semiconductor as a major component. The crystalline oxide semiconductor thin film also preferably includes a non-magnetic metal (e.g., Ga, Ti, V, In) as a major component rather than a magnetic metal (e.g., Fe, Co, Ni), since the semiconductor properties are further improved. The crystalline oxide semiconductor thin film is preferably monocrystalline, but may be polycrystalline. For the composition of the crystalline oxide semiconductor thin film, the atomic ratio of gallium, indium, aluminum, and iron to all the metal elements included in the thin film is preferably 0.5 or more, and the atomic ratio of gallium to all the metal elements is more preferably 0.5 or more. The preferable atomic ratio is, for example, 0.5, 0.6, 0.7, 0.8, 0.9, or 1 and may be between any two of the values presented. The reason why the atomic ratio of gallium to all the metal elements is more preferably 0.5 or more is that if so, an abnormal grain inhibition function can be expressed more effectively in the raw-material solution and thus the surface roughness of the crystalline oxide semiconductor thin film can be further reduced.

The composition of the crystalline oxide semiconductor thin film is preferably, for example, $In_X Al_Y Ga_Z Fe_V O_3$ ($0 \leq X \leq 2.5$, $0 \leq Y \leq 2.5$, $0 \leq Z \leq 2.5$, $0 \leq V \leq 2.5$, $X+Y+Z+V=1.5$ to 2.5), more preferably $1 \leq Z$. In this formula, preferable X, Y, Z, and V are each, for example, 0, 0.01, 0.05, 0.1, 0.2, 0.3, 0.4, 0.5, 0.6, 0.7, 0.8, 0.9, 1, 1.1, 1.2, 1.3, 1.4, 1.5, 1.6, 1.7, 1.8, 1.9, 2, 2.1, 2.2, 2.3, 2.4, or 2.5. Preferable X+Y+Z+V is, for example, 1.5, 1.6, 1.7, 1.8, 1.9, 2, 2.1, 2.2, 2.3, 2.4, or 2.5. X, Y, Z, and V and X+Y+Z+V may each be between any two of the values presented. Note that the above-mentioned formula represents the composition of atoms on lattice points forming a corundum structure. As is apparent from the fact that the formula is not described in the form of "X+Y+Z+V=2", the formula may include a non-stoichiometric oxide, which then may include a metal-deficient oxide or an oxygen-deficient oxide.

The crystalline oxide semiconductor thin film is formed directly on the base substrate or with another layer therebetween. Examples of the said another layer include corundum-structured crystal thin films having another composition, not-corundum-structured crystal thin films, and amorphous thin films.

The crystalline oxide semiconductor thin film is preferably doped at least partially (more specifically, partially in the thickness direction). It may also have any of a monolayer structure and a multilayer structure. If the crystalline oxide thin film has the multilayer structure, it is formed by laminating thin films, for example, an insulating thin film and a conductive thin film. However, the present invention is not limited thereto. If the crystalline oxide thin film has the multilayer structure in which the insulating thin film and the conductive thin film are laminated, the compositions of these thin films may be the same or different. The thickness ratio of the conductive thin film to the insulating thin film is not particularly limited, but is preferably, for example, 0.001 to 100, more preferably 0.1 to 5. The more preferable ratio is, for example, 0.1, 0.2, 0.3, 0.4, 0.5, 0.6, 0.7, 0.8, 0.9, 1, 1.1, 1.2, 1.3, 1.4, 1.5, 1.6, 1.7, 1.8, 1.9, 2, 3, 4, or 5, or may be between any two of the values presented.

The conductivity of the conductive thin film may be obtained by doping. The concentration of impurities for doping is determined as appropriate based on properties of the conductive thin film is required to have and is preferably $1E15/cm^3$ to $1E20/cm^3$. The type of the doping impurities is not particularly limited, but includes, for example, dopants containing at least one selected from Ge, Sn, Si, Ti, Zr, and Hf. The insulating thin film usually need not be doped, but may be doped to the extent that it does not exhibit conductivity.

The thickness of the crystalline oxide semiconductor thin film is not particularly limited and may be any of less than 1 µm and 1 µm or more, but is preferably 1 µm or more, more preferably 1 to 20 µm. By employing such the preferable thickness, it is possible to further improve the surface smoothness without degrading the semiconductor properties, as well as to reduce the electric resistance by annealing to further improve the semiconductor properties.

The crystalline multilayer structure of the present embodiment is manufactured by generating raw-material fine particles by atomizing a raw-material solution, carrying the raw-material fine particles into a film-forming chamber using a carrier gas, and forming the corundum-structured crystalline oxide semiconductor thin film on the base substrate in the film-forming chamber while doping the thin film with the abnormal grain inhibitor. Thus, the surface roughness (Ra) of the crystalline oxide semiconductor thin film is reduced to 0.1 µm or less. In the present embodiment, the abnormal grain inhibitor is preferably included in the raw-material solution. Thus, it is possible to efficiently and industrially advantageously manufacture the crystalline multilayer structure including the crystalline oxide semiconductor thin film whose surface roughness is 0.1 µm or less.

As used herein, the abnormal grain inhibitor refers to a substance having an effect of inhibiting an occurrence of grains as the byproducts in the film forming process. The abnormal grain inhibitor is not particularly limited as long as it can reduce the surface roughness of the crystalline oxide semiconductor thin film to 0.1 µm or less, but preferably includes at least one selected from Br and I. In order to form the film stably, by introducing Br or I as the abnormal grain inhibitor into the thin film, an increase in the surface roughness caused by a growth of abnormal grains can be prevented. In the present embodiment, it is most preferable to use Br as the abnormal grain inhibitor. By using Br, it is possible to significantly smooth the surface of the crystalline oxide semiconductor thin films, particularly ones including $\alpha\text{-}Ga_2O_3$ as the major component. The amount of the abnormal grain inhibitor to be added is not particularly limited as long as it can inhibit abnormal grains; however, the volume percentage of the abnormal grain inhibitor in the raw-material solution is preferably 50% or less, more preferably 30% or less, most preferably between 10 to 20%. By using such the preferable amount of the abnormal grain inhibitor, it is possible to effectively inhibit the growth of abnormal grains on the crystalline oxide semiconductor thin film to smooth the surface.

A method of forming the crystalline oxide semiconductor thin film is not particularly limited, but, for example, the crystalline oxide semiconductor thin film can be formed by mixing a gallium compound, an indium compound, an aluminum compound, and an iron compound according to the composition of the crystalline oxide semiconductor thin film and then oxidizing the resulting raw-material compound. Thus, the crystalline oxide semiconductor thin film can be grown on the base substrate from the base substrate side. The gallium compound and the indium compound may be obtained by serving a gallium metal and a indium metal as start material and converting them into the gallium compounds and the indium compounds immediately before forming a film. The gallium compound, the indium compound, the aluminum compound, and the iron compound are, for example, organometallic complexes (e.g., acetylacetonate complexes) or halides (fluorides, chlorides, bromides, or iodides) with respect to the respective metals.

More specifically, the crystalline oxide semiconductor thin film can be formed by atomizing the raw-material solution having the raw-material compounds dissolved therein, generating the raw-material fine particles from the raw-material solution, carrying the raw-material fine particles into a film-forming chamber, and causing the raw-material compounds to react in the chamber. The solvent of the raw-material solution is preferably water, hydrogen peroxide water, or organic solvent. In order to form a doped thin film, the raw-material compounds may be oxidized in the presence of dopant raw-materials. The dopant raw materials are preferably added to the raw-material solution and then atomized with the raw-material compounds.

The dopant raw materials are, for example, metals or metal compounds (e.g., halides, oxides) serving as impurities. Conceivable dopants for controlling electron conductivity include, but not limited to, n-type dopants such as Ge, Sn, Si, Ti, Zr, or Hf. By introducing an n-type dopant which is ten or more times higher in concentration than Br or I, which serves as an abnormal grain inhibitor, the carrier density is easily controlled. Note that in the present embodiment, materials different from the abnormal grain inhibitor are usually used as dopant raw materials.

In the present invention, the content of the abnormal grain inhibitor in the crystalline oxide semiconductor thin film is preferably 3E+15 to 7E+18 (atoms/cc), more preferably 3E+15 to 3E+18 (atoms/cc), most preferably 1E+16 to 2E+18 (atoms/cc).

In the present embodiment, the formed thin film may be annealed. The annealing temperature is not particularly limited, but is preferably 600° C. or less, more preferably 550° C. or less, most preferably 500° C. or less. By annealing the crystalline oxide semiconductor thin film at such the preferable temperature, the electric resistance thereof can be reduced more favorably. The annealing time is not particularly limited as long as the objects of the present invention are not impaired, but is preferably 10 seconds to 10 hours, more preferably 10 seconds to one hour.

Example Configuration of Crystalline Multilayer Structure

FIG. 1 shows a preferred example of the crystalline multilayer structure of the present embodiment and a semiconductor device using the crystalline multilayer structure. In an example of FIG. 1, a crystalline oxide semiconductor thin film 3 is formed on a base substrate 1. The crystalline oxide semiconductor thin film 3 is formed by laminating an insulating thin film 3a and a conductive thin film 3b in this order from the base substrate side. A gate insulating film 5 is formed on the conductive thin film 3b. A gate electrode 7 is formed on the gate insulating film 5. Source/drain electrodes 9 are formed on the conductive thin film 3b so as to sandwich the gate electrode 7. Such a configuration allows for a control of a depletion layer formed in the conductive thin film 3b by an application of a gate voltage to the gate electrode 7, thereby allowing for a transistor operation (FET device).

Examples of a semiconductor device formed using the crystalline multilayer structure of the present embodiment include transistors or TFTs such as MIS or HEMT, Schottky barrier diodes using a metal-semiconductor junction, p-n or PIN diodes combined with another p-type layer, and light emitting/receiving devices.

Example

Described below is an Example of the present invention. While a doped crystalline oxide semiconductor thin film is formed by the mist CVD in the Example below, the present invention is not limited to this Example.

1. CVD Apparatus

Figure 2:
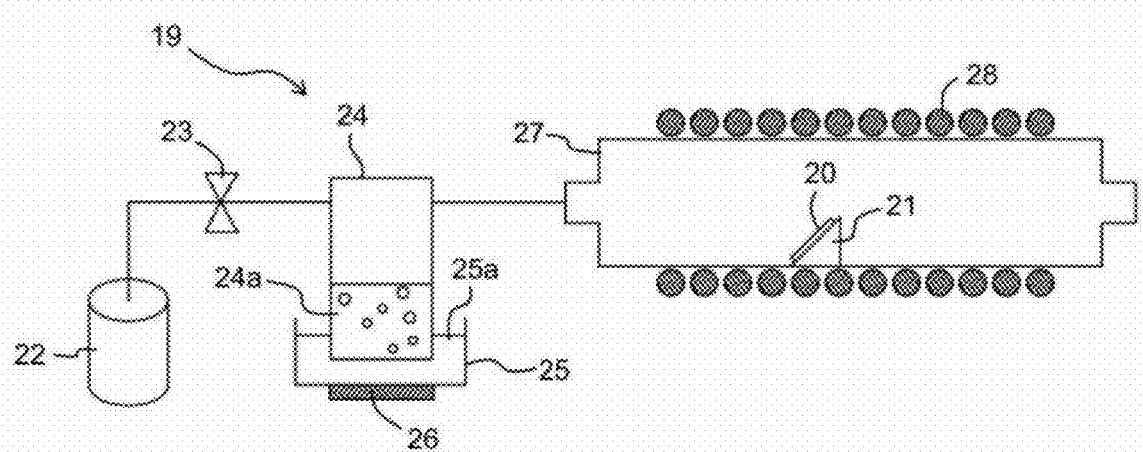
FIG. 2 is a configuration diagram of a mist CVD apparatus used in Example of the present invention.

First, referring to FIG. 2, a CVD apparatus 19 used in this Example will be described. The CVD apparatus 19 includes a sample stage 21 for placing a sample 20 on which films are to be formed, such as a base substrate, a carrier-gas source 22 for providing a carrier gas, a flow rate control valve 23 for controlling the flow rate of the carrier gas sent from the carrier-gas source 22, a mist source 24 including a raw-material solution 24a, a container 25 containing water 25a, an ultrasonic transducer 26 attached to the bottom of the container 25, a film forming chamber 27 formed of a 40-mm-inner-diameter quartz tube, and a heater 28 disposed around the film forming chamber 27. The sample stage 21 is formed of quartz, and the surface thereof for placing the sample 20 is inclined from the horizontal plane. By forming both the film forming chamber 27 and the sample stage 21 from quartz, entry of apparatus-derived impurities into the films formed on the sample 20 is reduced.

2. Preparation of Raw-Material Solution

An aqueous solution was prepared from gallium bromide and germanium oxide such that the atomic ratio of germanium to gallium was 1:0.05. To facilitate dissolution of germanium oxide, a 48% solution of hydrobromic acid was added to the aqueous solution at a volume percent of 10%.

Then, another solution was prepared in the same manner except that gallium iodide and a hydroiodic acid solution were used in place of gallium bromide and the hydrobromic acid solution, respectively.

3. Preparation for Film Forming

Next, a 10 mm-side square, 600 μm-thick c-plane sapphire substrate was placed as the sample 20 on the sample stage 21. Then the heater 28 was activated to raise the temperature in the film forming chamber 27 to 500° C. Next, the flow rate control valve 23 was opened to send the carrier gas from the carrier-gas source 22 into the film forming chamber 27. After the carrier gas sufficiently substituted for the atmosphere in the film forming chamber 27, The flow rate of the carrier gas was adjusted to 5 L/min. An oxygen gas was used as the carrier gas.

4. Formation of Thin Film

Next, the ultrasonic transducer 26 was vibrated at 2.4 MHz so that the vibration was propagated to the raw-material solution 24a through the water 25a. Thus, the raw-material solution 24a was atomized into raw-material fine particles. The raw-material fine particles were carried into the film forming chamber 27 by the carrier gas and then the thin film was formed by a CVD reaction on the film forming surface of the sample 20.

5. Evaluation

The phases of the formed thin films were identified. The identification was made by 2θ/ω scanning each thin film at angles of 15 to 95 degrees using an XRD diffractometer for thin films. Then, measurements were made using CuKα rays. As a result, the formed thin films were found to be corundum-structured α-gallium oxide thin films.

After 0.5 mm-diameter indium electrodes were pressure-bonded on the thin films at intervals of 1 mm, each thin film was annealed at 500° C. in a nitrogen atmosphere for 20 minutes. After annealing, XRD measurements were made again. It was confirmed that no phase transition occurred and the crystal structure of α-gallium oxide was maintained. Note that in this Example, the thicknesses of the thin films were measured using an interference thickness meter.

6. Surface Roughness

Then, by using a microscopy, measurements were made on the surface roughness of the resulting 1.5 μm-thick α-gallium oxide thin film samples, ones including an abnormal grain inhibitor (Br or I) and one including no abnormal grain inhibitor. As shown in Table 1, the surface of the sample including no abnormal grain inhibitor was very rough. On the other hand, the samples including an abnormal grain inhibitor showed a Ra value of several nm to several tens of nm and were thick films having high surface smoothness where no abnormal grains were observed.

TABLE 1

|  |  | Surface roughness Ra |
|---|---|---|
| Without abnormal grain inhibitor |  | 1200 nm |
| With abnromal grain inhibitor | Br | 8 nm |
|  | I | 29 nm |

Note that an α-gallium oxide thin film sample including no abnormal grain inhibitor (thickness: 1 µm or less) was surface-treated by CMP as an comparative example. As a result, the thin film was lost, so that the sapphire substrate was entirely exposed.

Test Example

Samples each including an abnormal grain inhibitor were prepared in the same way as mentioned above. About 10 samples were prepared for each abnormal grain inhibitor. The minimum and maximum in-film content (atomic ratio) of the abnormal grain inhibitor was measured by use of SIM for the obtained samples. The result is shown in Table 2.

TABLE 2

|  |  | In-film content (atomic ratio) of abnormal grain inhibitor | |
|---|---|---|---|
|  |  | Minimum | Maximum |
| Abnromal grain inhibitor | Br | 1E+16 | 2E+18 |
|  | I | 3E+15 | 7E+18 |
|  |  |  | 3E+18 (second maximum) |

The crystalline multilayer structure of the present invention is useful for semiconductor devices, including transistors or TFTs such as MIS or HEMT, Schottky barrier diodes using a metal-semiconductor junction, p-n or PIN diodes combined with another p-type layer, and light emitting/receiving devices.

The embodiments of the invention in which an exclusive property or privilege is claimed are defined as follows:

1. A crystalline oxide semiconductor film comprising:
   a corundum-structured oxide semiconductor;
   a surface roughness (Ra) that is 0.1 µm or less; and
   a thickness that is 1 µm or more.
2. The crystalline oxide semiconductor film of claim 1 comprising:
   a non-magnetic metal.
3. The crystalline oxide semiconductor film of claim 1, wherein the crystalline oxide semiconductor film comprises at least gallium.
4. A semiconductor device comprising:
   the crystalline oxide semiconductor film of claim 3; and
   an electrode arranged on the crystalline oxide semiconductor film.
5. The crystalline oxide semiconductor film of claim 1, wherein the crystalline oxide semiconductor film is at least partially doped.
6. A semiconductor device comprising:
   the crystalline oxide semiconductor film of claim 5; and
   an electrode arranged on the crystalline oxide semiconductor film.
7. The crystalline oxide semiconductor film of claim 1 comprising:
   a dopant.
8. The crystalline oxide semiconductor film of claim 7, wherein the dopant is at least one selected from Ge, Sn, Si, Ti, Zr and Hf.
9. A semiconductor device comprising:
   the crystalline oxide semiconductor film of claim 8; and
   an electrode arranged on the crystalline oxide semiconductor film.
10. A semiconductor device comprising:
    the crystalline oxide semiconductor film of claim 7; and
    an electrode arranged on the crystalline oxide semiconductor film.
11. The crystalline oxide semiconductor film of claim 1, further comprising an insulating film.
12. The crystalline oxide semiconductor film of claim 11, wherein the crystalline oxide semiconductor film laminated on the insulating film has a multilayer structure.
13. A semiconductor device comprising:
    the crystalline oxide semiconductor film of claim 11; and
    an electrode arranged on the insulating film.
14. The crystalline oxide semiconductor film of claim 1 comprising:
    at least one selected from Br and I.
15. The crystalline oxide semiconductor film of claim 1 comprising:
    α-$Ga_2O_3$.
16. A semiconductor device comprising:
    the crystalline oxide semiconductor film of claim 1; and
    an electrode arranged on the crystalline oxide semiconductor film.
17. A semiconductor device comprising:
    a crystalline oxide semiconductor film comprising a corundum-structured oxide semiconductor, a surface roughness (Ra) that is 0.1 µm or less, and a thickness that is 1 µm or more.
18. The semiconductor device of claim 17, wherein the crystalline oxide semiconductor film comprising at least gallium and a dopant.
19. The semiconductor device of claim 18 comprising:
    an electrode electrically connected to the crystalline oxide semiconductor film.
20. The semiconductor device of claim 17 comprising:
    an insulating film arranged on the crystalline oxide semiconductor film.

* * * * *